US012230424B1

United States Patent
Smith

(10) Patent No.: US 12,230,424 B1
(45) Date of Patent: Feb. 18, 2025

(54) BOND WIRE PAYOFF SYSTEM AND METHOD

(71) Applicant: Encore Wire Corporation, McKinney, TX (US)

(72) Inventor: Jeremy T. Smith, The Colony, TX (US)

(73) Assignee: Encore Wire Corporation, McKinney, TX (US)

( * ) Notice: Subject to any disclaimer, the term of this patent is extended or adjusted under 35 U.S.C. 154(b) by 317 days.

(21) Appl. No.: 17/730,412

(22) Filed: Apr. 27, 2022

Related U.S. Application Data

(60) Provisional application No. 63/180,314, filed on Apr. 27, 2021.

(51) Int. Cl.
*H01B 7/32* (2006.01)
*G01R 31/59* (2020.01)
*H01B 1/02* (2006.01)

(52) U.S. Cl.
CPC ............... *H01B 7/32* (2013.01); *G01R 31/59* (2020.01); *H01B 1/02* (2013.01)

(58) Field of Classification Search
None
See application file for complete search history.

(56) References Cited

U.S. PATENT DOCUMENTS

| 4,628,258 | A  | * | 12/1986 | Lischke | G01R 31/305 |
| | | | | | 324/750.02 |
| 9,397,066 | B2 | * | 7/2016 | Wang | B23K 37/047 |
| 11,597,031 | B2 | * | 3/2023 | Xu | B23K 20/26 |
| 2008/0073410 | A1 | * | 3/2008 | Farassat | B23K 31/12 |
| | | | | | 228/8 |
| 2012/0119012 | A1 | * | 5/2012 | Tai | B65H 75/245 |
| | | | | | 242/534 |
| 2017/0102421 | A1 | * | 4/2017 | Ramirez | G01R 31/58 |
| 2020/0316817 | A1 | * | 10/2020 | Rieger | B23D 57/0053 |

FOREIGN PATENT DOCUMENTS

| CN | 210594611 U | * | 5/2020 | |
| KR | 19980067096 A | * | 10/1998 | |
| TW | 202011039 A | * | 3/2020 | ......... G01R 27/2605 |

OTHER PUBLICATIONS

Translation of CN-210594611-U (Year: 2020).*
Translation of KR-19980067096-A (Year: 1998).*
Translation of TW-202011039-A (Year: 2020).*

* cited by examiner

Primary Examiner — Jermele M Hollington

(74) Attorney, Agent, or Firm — Warren Rhoades LLP

(57) ABSTRACT

System and method for improved bond wire payoff during the armoring process of armored cables and metal-clad cables is disclosed. A bond wire payoff system includes a bare bond wire; a bond wire payoff assembly; a sensor assembly connected to the bond wire payoff assembly, wherein the bare bond wire passes through the sensor assembly; a controller coupled with the sensor assembly, wherein the controller detects a break in the bare bond wire; and an alarm, wherein the alarm is triggered when a break in the bare bond wire is detected.

19 Claims, 8 Drawing Sheets

BOND WIRE PAYOFF SYSTEM AND METHOD

CROSS-REFERENCE TO RELATED APPLICATIONS

The subject application claims priority to and benefit of U.S. Provisional Application Ser. No. 63/180,314, filed on Apr. 27, 2021, which is fully incorporated by reference herein.

STATEMENT REGARDING FEDERALLY SPONSORED RESEARCH OR DEVELOPMENT

Not applicable.

REFERENCE TO A COMPACT DISK APPENDIX

Not applicable.

BACKGROUND OF THE INVENTION

1. Field of the Invention

This invention relates to a system and method for improved bond wire payoff during the armoring process of armored cables and metal-clad cables. More specifically, it relates to a system and method for minimizing the likelihood of a bond wire break during the armoring process and detecting such breaks.

2. Description of Related Art

Armored cables and metal-clad cables are typically comprised of a metal sheath enclosing one or more insulated electrical wires or cables. Some armored cables and metal-clad cables include a bare bond wire within the metal sheath that serves as the ground path. During the manufacturing process of these types of cables, a bond wire and one or more electrical wires or cables are typically paid off from separate stems and into an armoring machine to ultimately be combined and enclosed by a metallic protective armor. This is commonly referred to as the armoring process. During the armoring process, it is common for the bond wire to break, unbeknownst to the operator, resulting in an armored cable or metal-clad cable that is missing the internal bond wire. For example, the bond wire may break inside the armoring machine, making it difficult for the operator to conclude whether or not the bond wire was properly paid off from its separate stem and into armoring machine during the armoring process. The operator may be unable to visually locate any areas of the armored cable or metal-clad cable that are missing the internal bond wire while the line is running. As a result, the operator may be required to manually stop the entire armoring line altogether, if and when the operator discovers that the bond wire is no longer being properly paid off into the armoring machine. Once the armoring line is manually stopped by the operator, the operator is further required to pull the resulting armored cable or metal-clad cable back from the armoring machine and cut the metallic protective armor until the bond wire is located, resulting in excess scrap and delayed production to ensure the areas of missing bond wire were removed.

In a prior art solution, a tripod system would be used to horizontally payoff the bond wire from its separate stem and into the rear of the armoring machine. In another prior art solution, an extended hook system would be used to also horizontally payoff the bond wire from its separate stem and into the armoring machine. These prior art systems, however, utilize a horizontal payoff wire path for the bond wire between its separate stem and the armoring machine, resulting in an increased likelihood of the bond wire breaking during the armoring process. These systems further rely upon continual visual inspection by the operator to ensure that the bond wire has been properly paid off from its separate stem through either the tripod or extended hook system and into the armoring machine during the armoring process. These systems fail if the operator does not manually stop the entire armoring line when the bond wire is no longer being properly paid off from its separate stem and into the armoring machine, resulting in an armored cable or metal-clad cable that is missing the required internal bond wires. Additionally, these prior art systems have resulted in additional safety concerns for its operators since they are heavy and bulky.

A need exists for a bond wire payoff system and method that minimizes the likelihood of bond wires breaking during the armoring process of armored cables and metal-clad cables and that further detects such breaks, as the bond wire is paid off from its separate stem. The importance of ensuring all products that are delivered to customers meets every quality standard is one of the most important parts of any manufacturing process.

BRIEF SUMMARY OF THE INVENTION

The present disclosure is directed at a system and method for improved bond wire payoff during the armoring process of armored cables and metal-clad cables. The system and method minimizes the likelihood of a bond wire from breaking during the armoring process of armored cables and metal-clad cables and that further detects such breaks, as the bond wire is paid off from its separate stem to ultimately be combined with electrical wires or cables and enclosed by a metallic protective armor.

This system and method detects any breaks in the bond wire, as the bond wire is being paid off from its separate stem and into the armoring machine during the armoring process of armored cables and metal-clad cables. In order to detect a break in the bond wire, this system and method utilizes one or more defined speed values to determine whether or not the bond wire is being properly paid off into the armoring machine. When one or more defined values are not met, this system and method sets off an audible and visual alarm to alert the operator that the bond wire is no longer being properly paid off into the armoring machine. If the alarm is not acknowledged by an operator, this system and method will shut the entire armoring line down corresponding to the broken bond wire.

BRIEF DESCRIPTION OF THE SEVERAL VIEWS OF THE DRAWINGS

The foregoing summary, as well as the following detailed description, will be better understood when read in conjunction with the appended drawings. For the purpose of illustration, there is shown in the drawings certain embodiments of the present disclosure. It should be understood, however, that the invention is not limited to the precise arrangements and instrumentalities shown.

In the drawings.

DETAILED DESCRIPTION OF THE INVENTION

Figure 1:
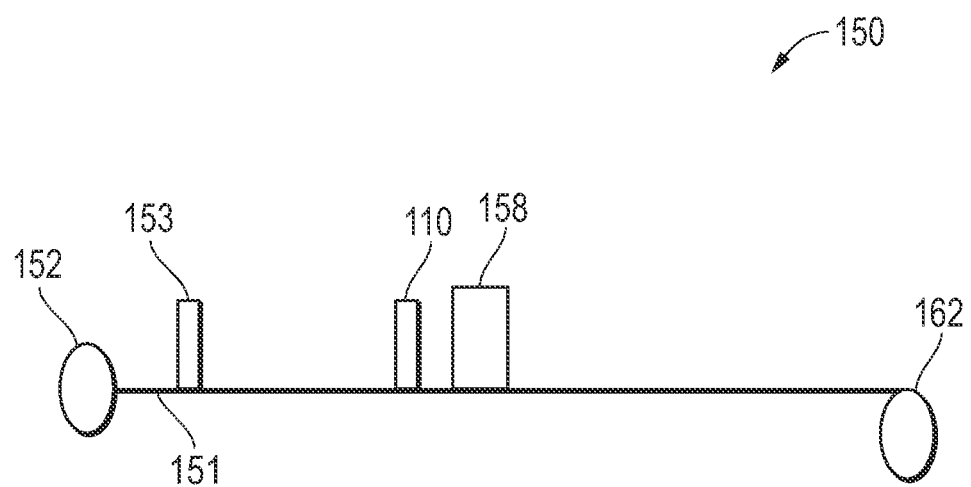
FIG. 1 is a diagram illustrating a system for armoring a wire or cable in accordance with an embodiment of the present disclosure.

Before explaining at least one disclosed embodiment of the invention in detail, it is to be understood that the invention is not limited in its application to the details of construction and to the arrangements of the components set forth in the following description or illustrated in the drawings. The invention is capable of other embodiments and of being practiced and carried out in numerous ways. Also, it is to be understood that the phraseology and terminology employed are for purpose of description and should not be regarded as limiting.

It should be understood that any one of the features of the invention may be used separately or in combination with other features. Other systems, methods, features, and advantages of the present invention will be or become apparent to one with skill in the art upon examination of the drawings and the detailed description. It is intended that all such additional systems, methods, features, and advantages be included within this description, be within the scope of the present invention, and be protected by accompanying claims.

The present disclosure is described below with reference to the Figures in which various embodiments of the present invention are shown. The subject matter of the disclosure may, however, be embodied in many different forms and should not be construed as limited to the exemplary embodiments set forth herein. It is also understood that the term "wire" is not limiting, and refers to wires, cables, electrical lines, or any other materials.

The present disclosure provides for a system and method for improved bond wire payoff during the armoring process of armored cables and metal-clad cables.

Referring now to FIGS. 1-6, by way of non-limiting example, and consistent with embodiments of the invention, an armoring of a wire or cable system 150 including a bond wire payoff system 110 is shown. The system for armoring a wire or cable 150 and the bond wire payoff system 110 may be constructed from any number of materials that are able to withstand the pressures and demands placed upon it. In one embodiment, the bond wire payoff system 110 is located before one or more armoring machines 158, known in the art.

Referring to FIG. 1, according to one embodiment, a standard payoff reel 152 to supply an internal conductor(s) 151, such as a copper or aluminum wire is provided in system 150. The standard payoff reel 152 supplies the internal conductor(s) 151 to an extruder 153 to apply an insulating material over the internal conductor(s) 151. Extruder 153 may be a single extruder head, a plurality of extruders, a cross head, a co-extrusion head, or any combination thereof. The insulating material may be thermoset, thermoplastic, elastomeric, polymeric dielectric or a semiconductor compound or any combination thereof. Once the internal conductor(s) 151 have been insulated by the extruder 153, the internal conductor(s) 151 proceed to the bond wire payoff system 110. The bond wire 138 and the insulated internal conductor(s) 151 proceed to the armoring machine 158. The armoring machine 158 includes, but is not limited to, a BX machine. After formation of the armored cable by the armoring machine 158, the armored cable, a motor-driven reel 162 is provided to wind up the resulting armored wire or cable. In one embodiment, preformed insulated wire or cable is pulled by the armoring machine 158 in conjunction with pulling the bond wire 138 through the bond wire payoff system 110.

Figure 2:
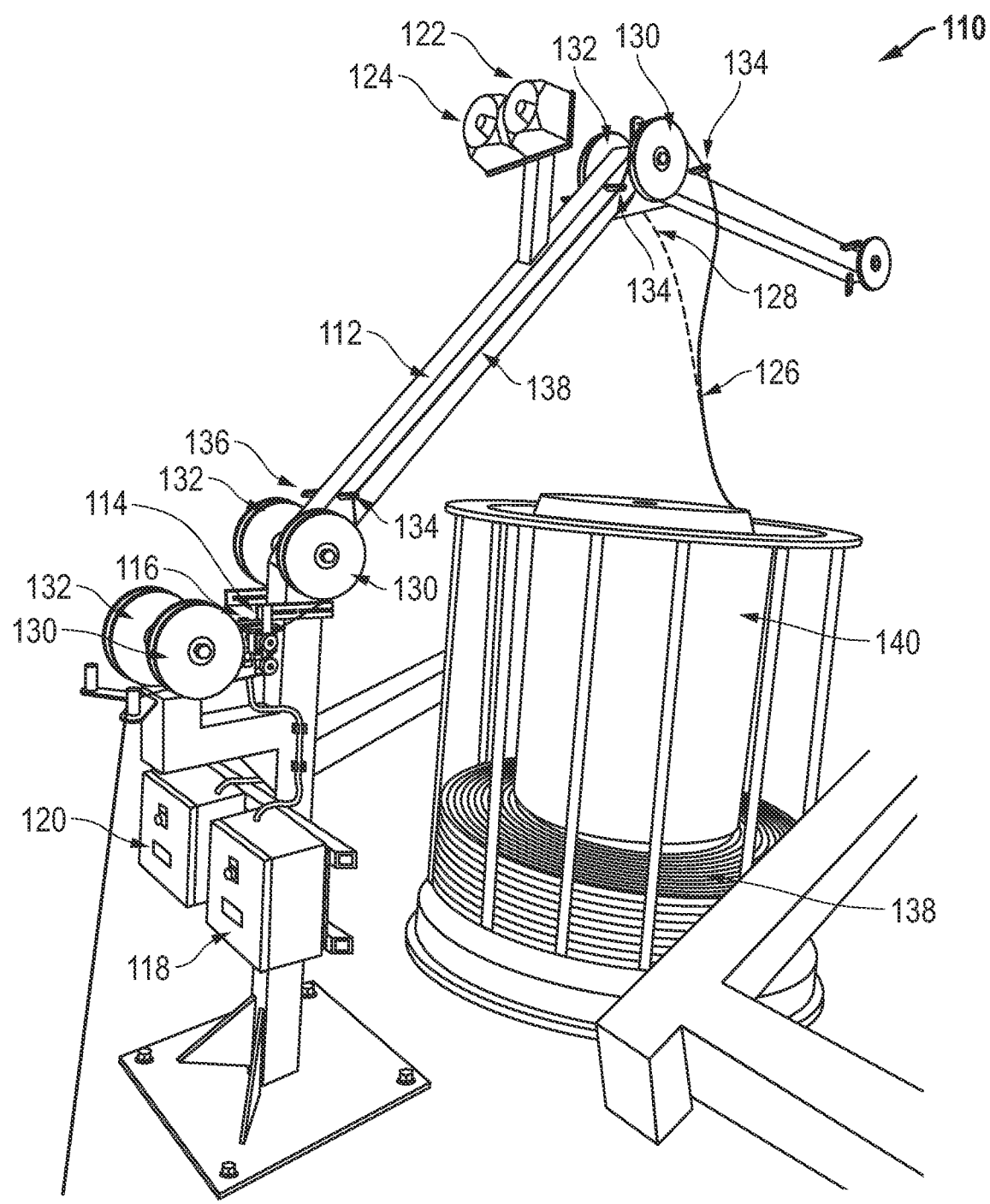
FIG. 2 illustrates the bond wire payoff system.

Referring now to FIG. 2, one embodiment of the bond wire payoff system 110 is shown. The bond wire payoff system 110 includes a bond wire payoff assembly 112, a first and second sensor assembly 114, 116, a first and second controller 118, 120, and a first and second alarm assembly 122, 124. The bond wire payoff assembly 112 includes a first and second payoff wire path 126, 128, and a first and second series of sheaves (or pulleys) 130, 132 and eyelets 134, 136. In this embodiment, the bond wire payoff system 110 is designed to payoff a bond wire 138 from a stem 140 by one or more armoring machines 158 in different armoring lines. In this embodiment, the bond wire payoff system 110 supports two (2) armoring wire or cable lines; each line runs exclusive of the other line. The first payoff wire path 126, the first series of sheaves 130 and eyelets 134, the first sensor assembly 114, and the first controller 118 payoff the bond wire 138 from the stem 140 when a first armoring wire or cable line is in use and the second payoff wire path 128, the second series of sheaves 132 and eyelets 136, the second sensor assembly 116, and the second controller 120 payoff the bond wire 138 from the same stem 140 and into a second armoring machine in a second armoring wire or cable line. In one embodiment, the bond wire 138 is a bare aluminum bond wire. The bond wire 138 may be constructed from a variety of other conductive metals including, but not limited to, copper, without detracting from the spirit of the invention. For example, bare aluminum bond wire is required by UL to be used in all AC and HCF metal clad products as a ground path. In another embodiment, multiple stems 140 may be implemented, one stem 140 for each armoring wire of cable line. In this embodiment, both armoring wire or cable lines may be in use simultaneously.

In one embodiment, the bond wire payoff system 110 includes one payoff wire path 126, one series of sheaves 130 and eyelets 134, one sensor assembly 114, and one controller 118 to payoff the bond wire 138 from the stem 140.

Figure 3:
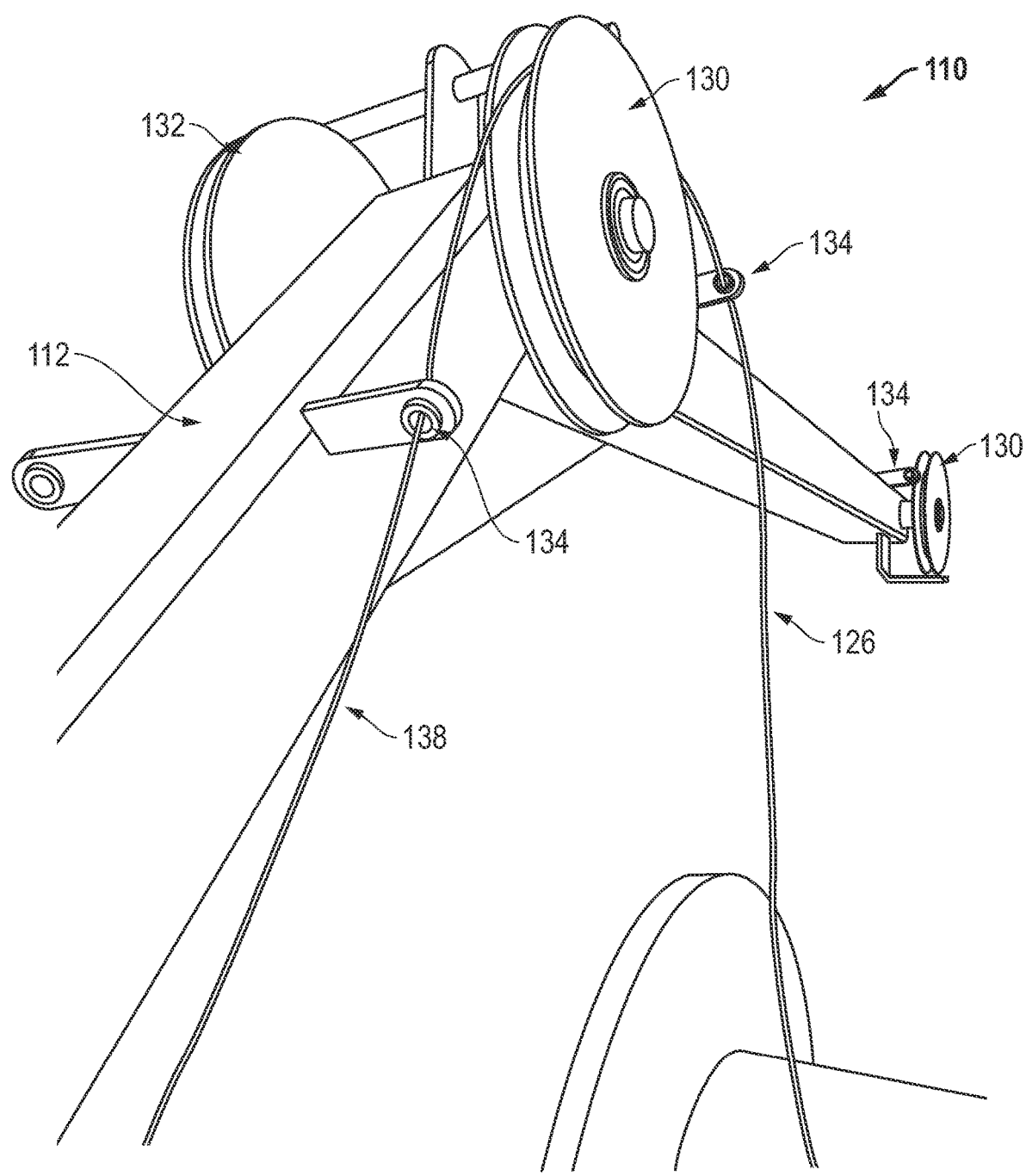
FIG. 3 illustrates a perspective view of the sheaves and eyelets of one embodiment of the bond wire payoff system.

As shown in FIG. 3, the bond wire payoff system 110 may utilize one or more sheaves 130, 132 and eyelets 134, 136 in various locations of the bond wire payoff assembly 112. It should be understood that the bond wire payoff system 110 may utilize one or more of payoff wire paths 126, 128, sheaves 130, 132 and eyelets 134, 136 sensor assemblies 114, 116, controllers 118, 120, and alarms 122, 124 in various locations of the bond wire payoff system 110, depending on the particular application of the bond wire payoff system 110.

The bond wire payoff system 110 pulls the bond wire 138 from the stem 140 along a variety of payoff wire path 126, 128 including, but not limited to, horizontal, vertical, or angular. In one embodiment, the bond wire payoff assembly 112 is advantageous over the prior art where the bond wire 138 is pulled along a vertical payoff wire path 126 and through a series of sheaves 130 and eyelets 134 as it reduces the overall stress and tension on the bond wire 138 as it is being paid off from the stem 140 during the armoring process. Unlike the prior art, in this embodiment the bond wire payoff system's 110 reduction in overall stress and tension on the bond wire 138 minimizes the likelihood of the bond wire breaking during the armoring process.

Figure 4A:
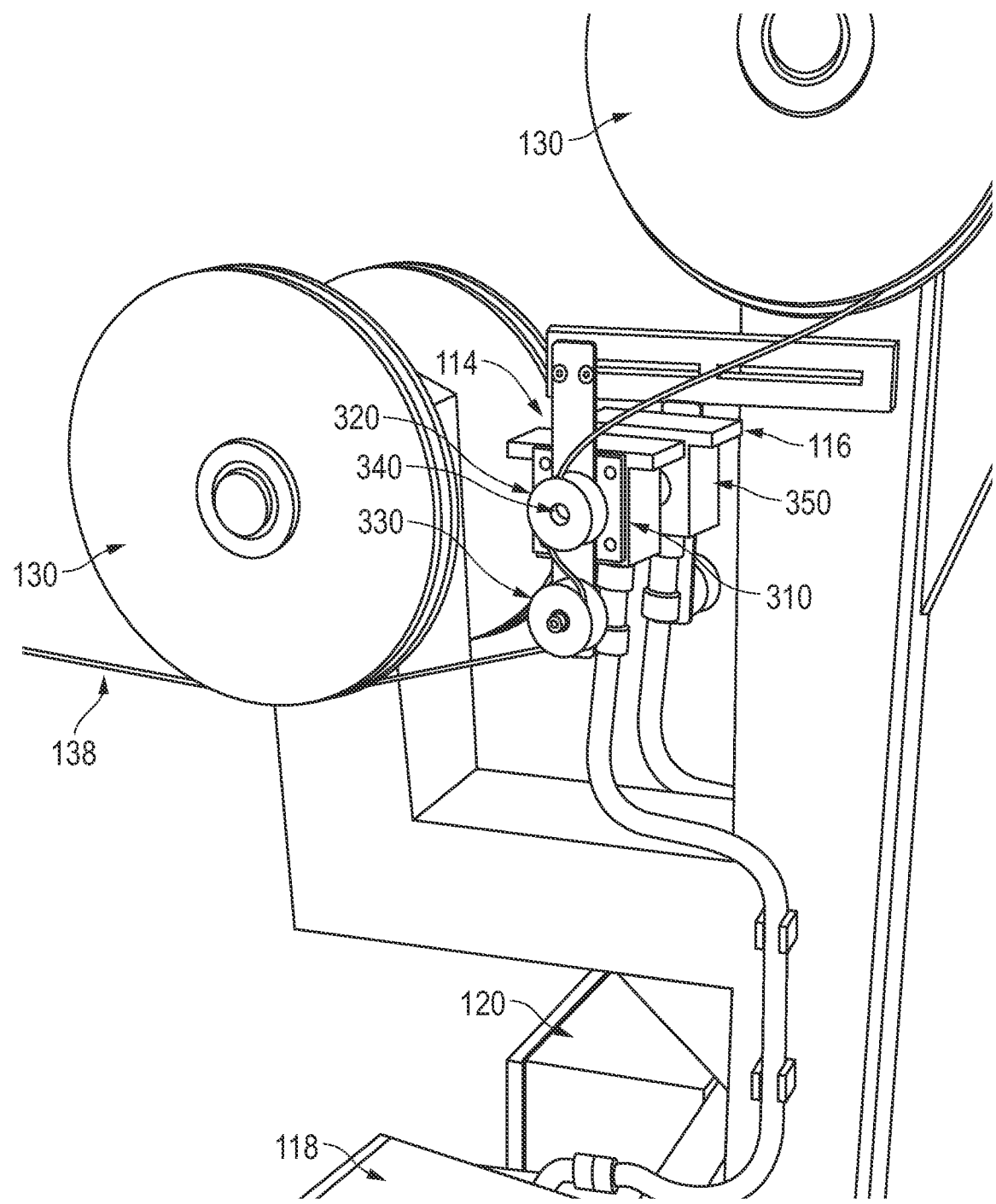
FIGS. 4A and 4B illustrate a perspective view of the first sensor assembly of one embodiment of the bond wire payoff system.
Figure 4B:
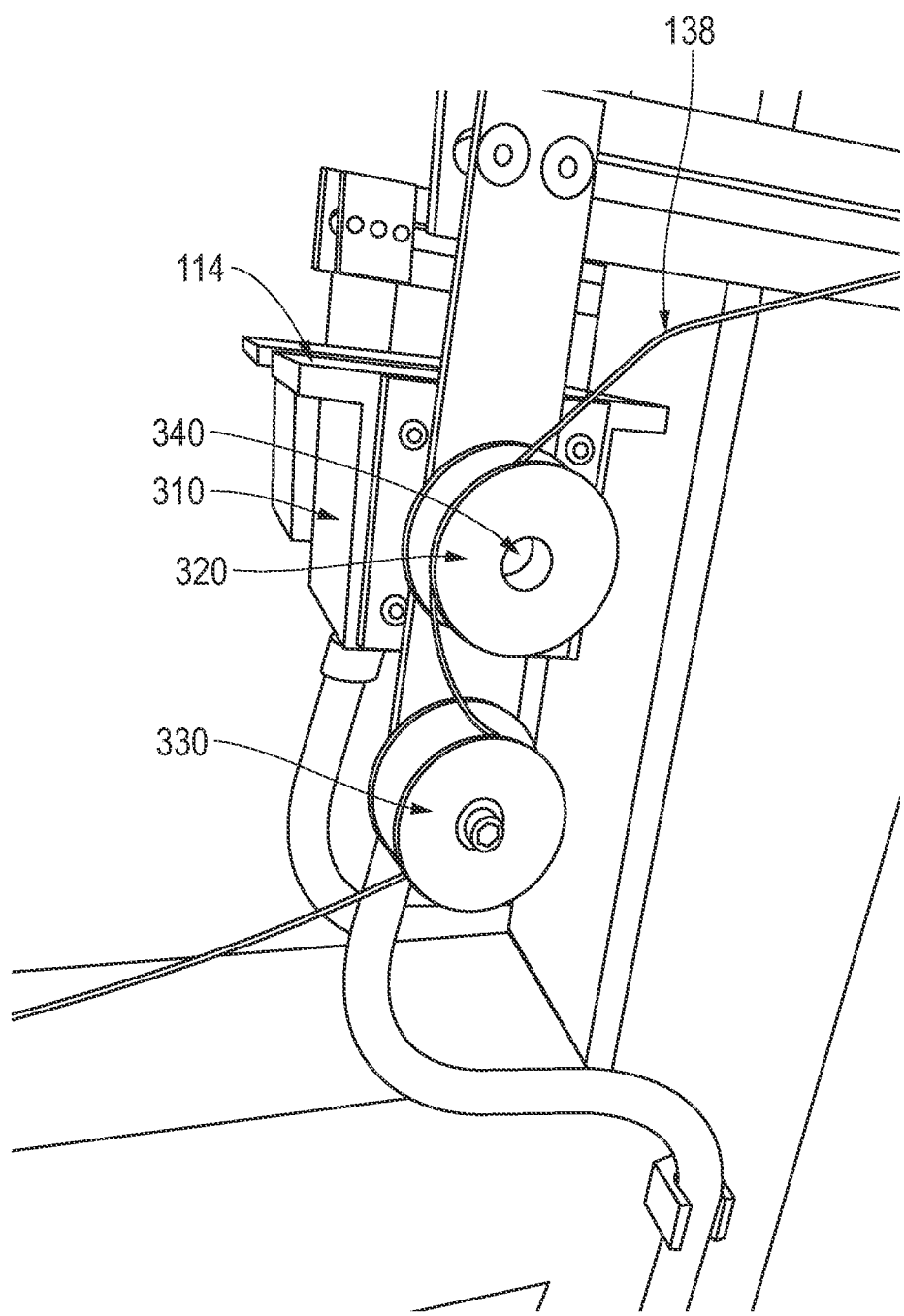

As shown in FIGS. 4A and 4B, the bond wire payoff system 110 includes the first sensor assembly 114 which includes a first sensor 310, a first sensor sheave 320, and a second sensor sheave 330. The first sensor sheave 320 is attached to the first sensor's shaft 340. The second sensor sheave 330 is attached to the first sensor assembly 114 so that the second sensor sheave 330 is able to rotate freely. In this embodiment, the second sensor sheave 330 provides tension to the bond wire 138 as the bond wire 138 travels through the first sensor assembly 114 to prevent the bond wire 138 from slipping off the first sensor sheave 320. The first sensor 310 of the first sensor assembly 114 is coupled to the first controller 118. A second sensor 350 of the second sensor assembly 116 is coupled to the second controller 120. In this embodiment, the second sensor assembly 116 includes a second sensor 350, a second set of sensor sheaves, and a second controller 120. The first and second sensor assemblies 114, 116 may have the same equipment and function in the same manner or may be composed of different equipment and functionality. In one embodiment, the first and second sensors 310, 350 are encoders. Each sensor assembly 114, 116 may utilize a greater number of sensors 310, 350 or sensor sheaves 320, 330, depending on the particular application of the bond wire payoff system 110. It should be understood that the sensor assemblies 114, 116 of the bond wire payoff system 110 may utilize a variety of types of sensors, including mechatronic sensors, without detracting from the spirit of the invention.

In operation, according to one embodiment, the bond wire 138 is first pulled from the stem 140 along the first payoff wire path 126 and through the first series of sheaves 130 and eyelets 134 of the bond wire payoff assembly 112. Next, the bond wire 138 is pulled through the first and second sensor sheaves 320, 330 of the first sensor assembly 114 by the armoring machine 158. The first sensor shaft 340 is rotated when the bond wire 138 is pulled through the first and second sensor sheaves 320, 330 of the first sensor assembly 114. After the bond wire 138 has been pulled through the first and second sensor sheaves 320, 330 of the first sensor assembly 114, the bond wire 138 continues through the remaining sheave 130 of the bond wire payoff assembly 112 and into the first armoring machine 158 to be combined with one or more electrical wires or cables. During the use of the second armoring wire or cable line, the bond wire 138 is pulled from the stem 140, through the second payoff wire path 128 and the second series of sheaves 132 and eyelets 136 of the bond wire payoff assembly 112; through the first and second sensor sheaves of the second sensor assembly 116; through the remaining sheave 132 of the bond wire payoff assembly 112 and into the second armoring machine to be combined with one or more electrical wires or cables.

Figure 5:
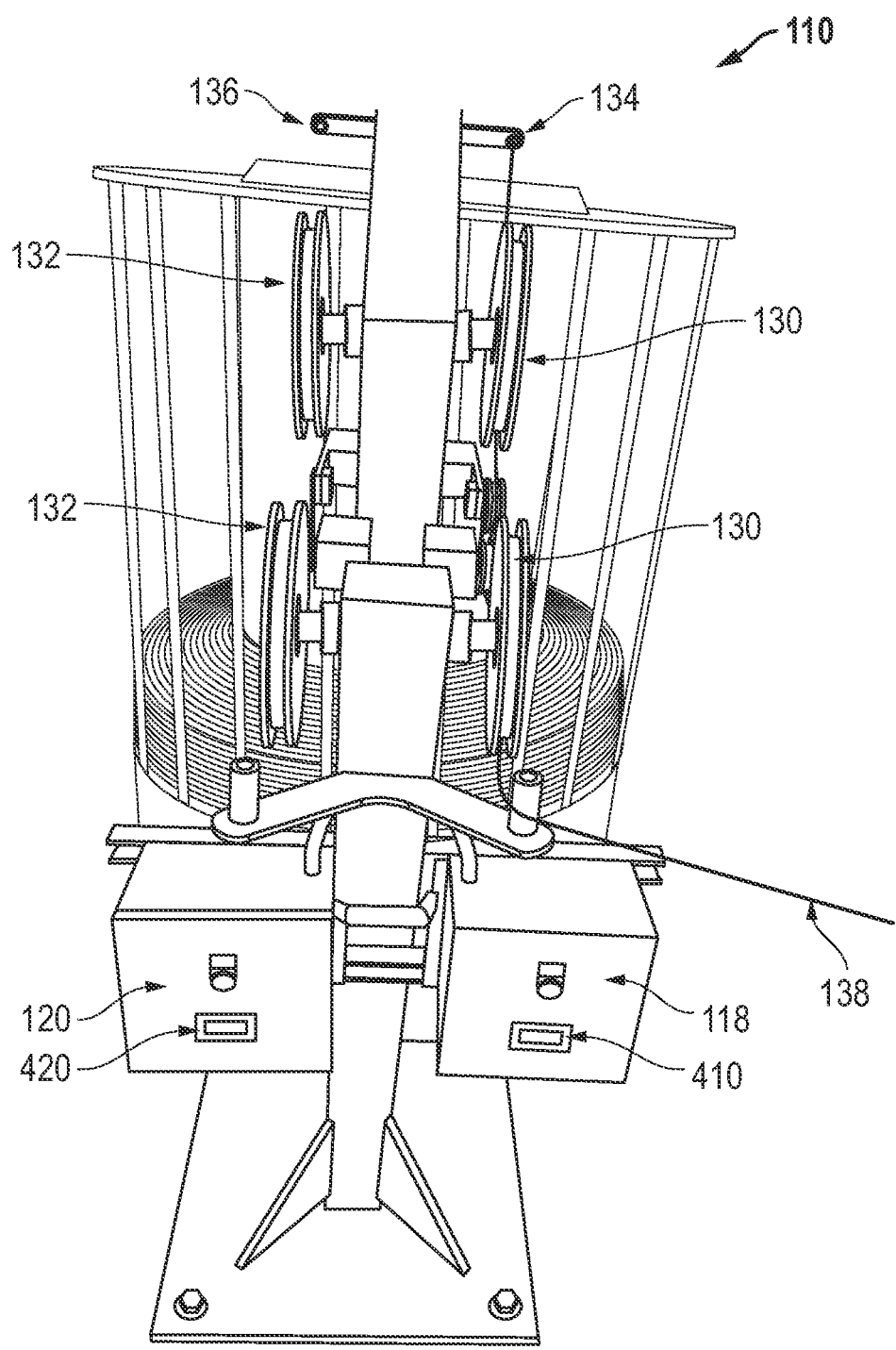
FIG. 5 illustrates a perspective view of controllers of the bond wire payoff system.

Referring now to FIG. 5, the first and second controllers 118, 120 include control screens 410, 420 which allow user input. In one embodiment, the first and second controllers 118, 120 are dual set point controllers that are each programmed to set a first and a second defined speed value. For example, in this embodiment, the first dual set point controller 118 is programmed to set a defined minimum speed value and a defined line speed value. The first defined speed value programmed into the dual set point controller 118 is the minimum speed value. The second defined speed value is the line speed value. The line speed value is programed into the dual set point controller 118 and is calculated as a value that is below the average of either the speed at which the armoring machine 158 is pulling the first bond wire 138; or the speed at which the armoring machine 158 is pulling one or more electrical wires or cables to be combined with the first bond wire 138. The speed values may be determined in terms of revolutions per minute or feet per minute. To activate the alarm system, the speed of the bond wire 138 must exceed the line speed value. The minimum speed value is less that the line speed value. The bond wire payoff system 110 alarm functionality is not engaged until the line speed value is reached to prevent false alarms of a broken bond wire 138 during the initial start-up procedure. The purpose of minimum speed value is to prevent false alarms from occurring during either a normal operational slow down or shut down of each armoring machine 158. In operation, according to one embodiment, the bond wire payoff system 110 alarm functionality is activated when the line speed value is reached by the first sensor 310 as a result of the bond wire 138 being pulled across the first and second sensor sheaves 320, 330 of the first sensor assembly 114 by the armoring machine 158 for greater than thirty (30) seconds. Once activated, the alarm functionality is triggered once the bond wire 138 speed drops below the minimum speed value. This drop initiates the alarm functionality. In one embodiment, the alarm functionality is only triggered when the bond wire 138 speed drops from above the line speed value to below the minimum speed value in less than five (5) seconds. If the drops is greater than five (5) seconds, the alarm functionality is not triggered as the slower drops signifies the shutdown of the armoring wire or cable line. In another embodiment, the first and second controllers 118, 120 are programmed to a single defined speed value that corresponds with either the speed at which the armoring machine 158 is pulling the bond wire 138; or the speed at which the armoring machine 158 is pulling one or more electrical wires or cables to be combined with the bond wire 138. In this embodiment, the alarm functionality is not activated until the speed value is met and the alarm functionality is not triggered until the bond wire 138 speed drops below the speed value. The bond wire payoff system 110 may utilize a variety of types of controllers without detracting from the spirit of the invention.

Figure 6:
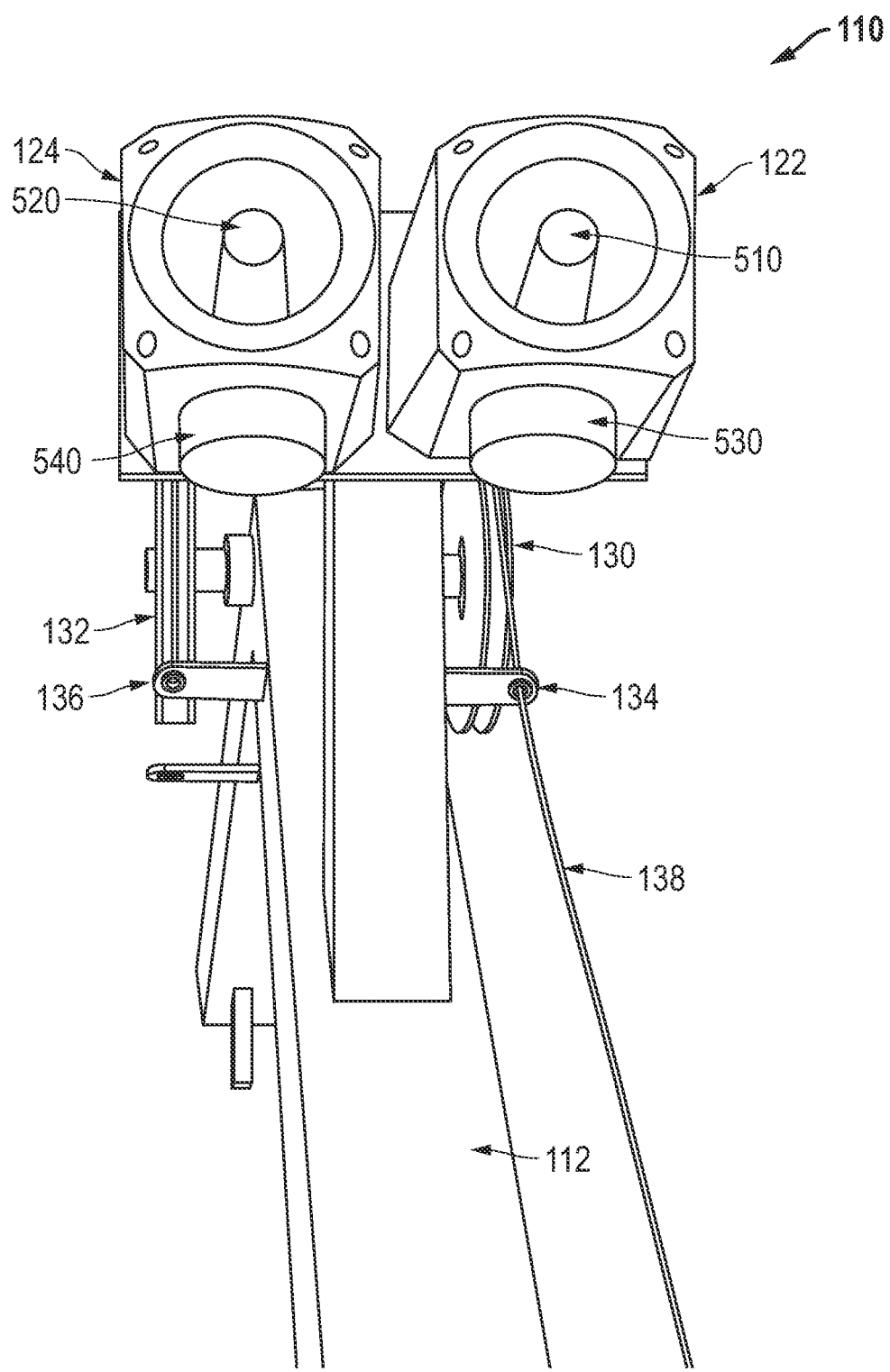
FIG. 6 illustrates a perspective view of the alarm assemblies of the bond wire payoff system.

Referring now to FIG. 6, the first and second alarm assemblies 122, 124 of the bond wire payoff system 110 are shown. The first and second alarm assemblies 122, 124 include siren speakers 510, 520 and flashing strobe lights 530, 540. In operation, the bond wire payoff system 110 detects a break in the bond wire 138 when the bond wire 138 speed drops below the defined line or minimum speed value. In this embodiment, the bond wire payoff system 110 detects a break in the bond wire 138 when the speed of the sensor's shaft 340 is no longer rotating at the defined line or minimum speed value programed into the dual set point controllers 118, 120. For example, in the event of a break in the bond wire 138, the first sensor's shaft 340 experiences a deceleration in its rotation because the bond wire 138 is no longer being pulled across the first and second sensor sheaves 320, 330 of the first sensor assembly 114 by the first armoring machine 158. In this embodiment, when a break occurs in the bond wire 138, the rate of deceleration of the bond wire 138 falls below the defined line or minimum speed value programmed into the dual set point controller 118. It is this decrease of the bond wire 138 speed to a value below the defined line or minimum speed value programmed into the dual set point controller 118 that triggers the alarm as described below. In the event of a break in the bond wire 138, the sensor's shaft 340 experiences an improper deceleration in its rotation because the bond wire 138 is no longer being pulled across the sensor sheaves 320, 330 of the sensor assembly 114 by the armoring machine 158. In another embodiment, the determination of a bond wire 138 break is made by comparison of the speed of the bond wire 138 with the speed of one or more electrical wires or cables which has been programmed into the dual set point controller.

When an improper deceleration occurs in either of the sensors' shafts 340, the bond wire payoff system 110 sets off the appropriate alarm assembly 122, 124 equipped with flashing strobe lights 530, 540 and loud repetitive alarm sound through the siren speakers 510, 520, correlating to the sensor shaft 340 that experienced the improper deceleration. For example, if the improper deceleration occurs in the first sensor's shaft 340, the bond wire payoff system 110 sets off the loud repetitive alarm sound through the siren speaker 510 and flashing strobe 530 of alarm assembly 122. If the improper deceleration occurs in the second sensor's shaft, the bond wire payoff system 110 sets off the loud repetitive alarm sound through the siren speaker 520 and flashing strobe 540 of alarm assembly 124. If either alarm 122, 124 is not acknowledged by the operator on the appropriate control screen 430, 440 of the bond wire payoff system 110, the bond wire payoff system 110 will shut the entire armoring line down corresponding to the broken bond wire.

Unlike the prior art, this system and method is independent of the operator's ability to maintain a continual visual inspection of the bond wire as it is being paid off from the stem and into the armoring machine and this system and method is also independent of the operator's ability to manually stop the entire armoring line once the operator notices a broken bond wire. This system further reduces the opportunity for an armored cable or metal-clad cable that is missing the required internal bond wire from being sent to a customer. Additionally, this system and method reduces the amount of scrap produced during the armoring process by immediately notifying the operator and those around that the bond wire is no longer being properly paid off into the armoring machine and further stopping the entire armoring line if the operator does not acknowledge the alarm.

Figure 7:
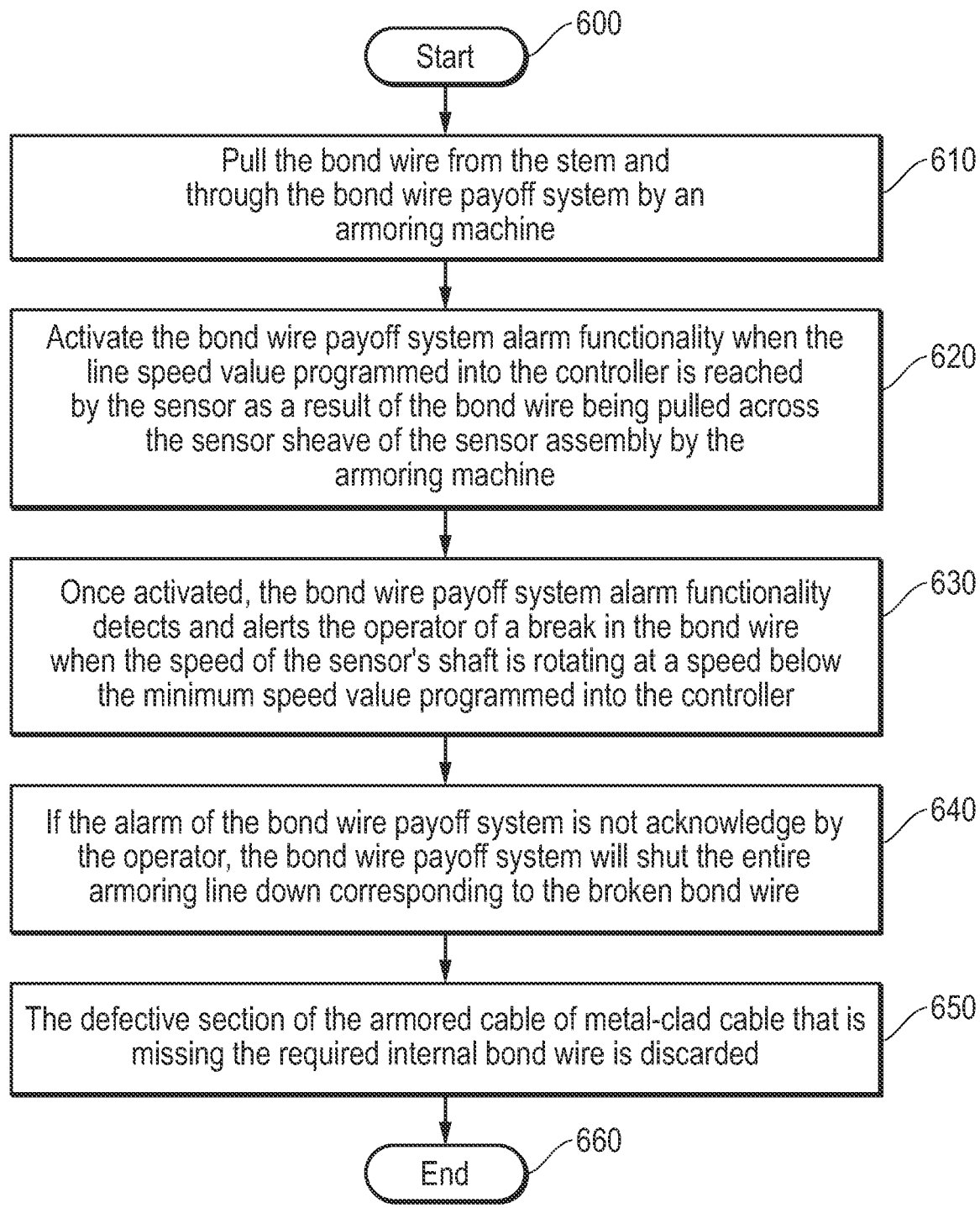
FIG. 7 depicts a flow chart of the bond wire payoff method in accordance with one embodiment of the present disclosure.

Referring now to FIG. 7, a flow chart of the bond wire payoff method is shown. The method begins with Start 600. Next, in step 610, the bond wire 138 is pulled from the stem and through the bond wire payoff system 110 by an armoring machine 158, known in the art. The bond wire 138 is pulled through a series of sheaves 130 and eyelets 134. The bond wire 138 may be pulled horizontally or vertically. Next, in step 620, the bond wire payoff system 110 alarm functionality is activated when the line speed value programmed into the controller 118 are reached by determining the rotation of the sensor's shaft 340 as a result of the bond wire 138 being pulled across the sensor sheaves 320, 330 of the sensor assembly 114 by the armoring machine 158. As the bond wire 138 is pulled through the sensor sheaves 320, 330, the sensor sheave 320 is rotated which then rotates the sensor's shaft 340. The speed of the bond wire 138 is determined through the measurement of the rotation of the sensor's shaft 340. In one embodiment, the alarm functionality is not activated unless the bond wire 138 speed exceeds the line speed for more than thirty (30) seconds. Next in step 630, the bond wire payoff system 110 detects and alerts the operator of a break in the bond wire 138 when the speed of the sensor's shaft 340 is no longer rotating at the defined minimum speed value programmed into the controller 118. The bond wire payoff system 110 alerts the operator through either or both an audio and visual alert. Next, in step 640, the bond wire payoff system 110 will shut the entire armoring line down if the alarm of the bond wire payoff system 110 is not acknowledged by the operator. Next, in step 650, the defective section of the armored cable or metal-clad cable that is missing the required bond wire 138 is discarded. The method ends 660.

Although the invention is described herein with reference to specific embodiments, various modifications and changes can be made without departing from the scope of the invention as set forth in the claims below. Accordingly, the specification and figures are to be regarded in an illustrative rather than a restrictive sense, and all such modifications are intended to be included within the scope of the invention. Any benefits, advantages, or solutions to problems that are described herein with regard to specific embodiments are not intended to be construed as a critical, required, or essential feature or element of any or all the claims.

From time-to-time, the invention is described herein in terms of these example embodiments. Description in terms of these embodiments is provided to allow the various features and embodiments of the invention to be portrayed in the context of an exemplary application. After reading this description, it will become apparent to one of ordinary skill in the art how the invention can be implemented in different and alternative environments. Unless defined otherwise, all technical and scientific terms used herein have the same meaning as is commonly understood by one of ordinary skill in the art to which this invention belongs.

The preceding discussion is presented to enable a person skilled in the art to make and use the invention. The general principles described herein may be applied to embodiments and applications other than those detailed below without departing from the spirit and scope of the invention as defined by the appended claims. The invention is not intended to be limited to the embodiments shown, but is to be accorded the widest scope consistent with the principles and features disclosed herein.

In addition, while a particular feature of the invention may have been disclosed with respect to only one of several embodiments, such feature may be combined with one or more other features of the other embodiments as may be desired. It is therefore, contemplated that the claims will cover any such modifications or embodiments that fall within the true scope of the invention.

The various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical, or physical partitioning and configurations can be implemented to implement the desired features of the invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one", "one or more" or the like; and adjectives such as "conventional", "traditional", "normal", "standard", "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed across multiple locations.

Unless stated otherwise, terms such as "first" and "second" are used to arbitrarily distinguish between the elements such terms describe. Thus, these terms are not necessarily intended to indicate temporal or other prioritization of such elements.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

All publications and patents mentioned in the above specification are herein incorporated by reference. Various modifications and variations of the described method and system of the invention will be apparent to those skilled in the art without departing from the scope and spirit of the invention. Although the invention has been described in connection with specific preferred embodiments, it should be understood that the invention as claimed should not be unduly limited to such specific embodiments. Indeed, various modifications of the described modes for carrying out the invention which are obvious to those skilled in the field or any related fields are intended to be within the scope of the following claims.

What is claimed is:

1. A bond wire payoff system, the bond wire payoff system comprising:
   a bond wire;
   a bond wire payoff assembly, wherein the bond wire passes through the bond wire payoff assembly;
   a sensor assembly connected to the bond wire payoff assembly, wherein the bond wire passes through the sensor assembly and wherein the sensor assembly comprises a rotatable sensor shaft and a rotatable sensor sheave connected to the rotatable sensor shaft;
   a controller coupled with the sensor assembly, wherein the controller detects a break in the bond wire; and
   an alarm coupled to the controller, wherein the alarm is triggered when a break in the bond wire is detected by the controller.

2. The system of claim 1, wherein the bond wire payoff assembly comprises a plurality of sheaves and eyelets.

3. The system of claim 2, wherein the bond wire is pulled through the plurality of sheaves and eyelets.

4. The system of claim 1, wherein the bond wire is an aluminum bond wire.

5. The system of claim 1, wherein the sensor assembly further comprises a tension sheave in contact with the bond wire.

6. The system of claim 1, wherein the rotatable sensor shaft decelerates when the bond wire breaks.

7. The system of claim 1, wherein the controller determines that the rotatable sensor shaft is decelerating to a value below a preprogrammed value.

8. The system of claim 7, wherein the controller triggers the alarm when the rotatable sensor shaft value is below the preprogrammed value.

9. The system of claim 7, wherein the controllers stop the bond wire payoff system if the alarm is not acknowledged.

10. The system of claim 1, wherein the alarm is an audible alarm.

11. The system of claim 1, wherein the alarm is a visual alarm.

12. The system of claim 1, wherein the controller is an encoder.

13. The system of claim 1, wherein a bond wire payoff assembly further comprises vertically passing the bond wire through the bond wire payoff assembly.

14. A method for detecting a break in a bond wire, the method comprising:
   pulling a bond wire, wherein the bond wire is pulled through a bond wire payoff assembly;
   passing the bond wire through a sensor assembly connected to the bond wire payoff assembly;
   determining the speed of the bond wire with the sensor assembly;
   comparing the speed of the bond wire with a predetermined speed to determine if the bond wire has a break; and
   triggering an alarm when the speed of the bond wire is below the predetermined speed.

15. The method of claim 14, wherein the step of pulling a bond wire comprises pulling the bond wire vertically.

16. The method of claim 14, wherein the step of pulling the bond wire through the bond wire assembly comprise the step of pulling the bond wire through at least one sheave and at least one eyelet.

17. The method of claim 14, wherein the step of passing the bond wire through a sensor assembly comprises passing the bond wire through a rotatable sensor sheave connected to a rotatable sensor shaft, wherein the passing bond wire rotates the rotatable sensor sheave and rotatable sensor shaft.

18. The method of claim 14, wherein the step of determining the speed of the bond wire comprises determining the rotational speed of the rotatable sensor shaft.

19. The method of claim 14, wherein the step of triggering an alarm when the speed of the bond wire is below the predetermined speed comprises triggering an audio and a visual alarm.

\* \* \* \* \*